(12) United States Patent  
Araya

(10) Patent No.: US 8,659,145 B2
(45) Date of Patent: Feb. 25, 2014

(54) SEMICONDUCTOR DEVICE

(75) Inventor: Azuma Araya, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/559,717

(22) Filed: Jul. 27, 2012

(65) Prior Publication Data

US 2013/0069212 A1 Mar. 21, 2013

(30) Foreign Application Priority Data

Sep. 16, 2011 (JP) ................................. 2011-203005

(51) Int. Cl.
H01L 23/48 (2006.01)
H01L 23/495 (2006.01)

(52) U.S. Cl.
USPC ............ 257/692; 257/668; 257/676; 257/738

(58) Field of Classification Search
USPC ......... 257/668, 676, 690–693, 695, 696, 737, 257/738, E23.021, E23.033
See application file for complete search history.

(56) References Cited

U.S. PATENT DOCUMENTS

| 6,833,608 | B2 | 12/2004 | Asano et al. | |
|---|---|---|---|---|
| 7,763,986 | B2* | 7/2010 | Kim | 257/786 |
| 7,795,710 | B2* | 9/2010 | Islam et al. | 257/666 |
| 8,395,246 | B2* | 3/2013 | Yu et al. | 257/676 |

FOREIGN PATENT DOCUMENTS

| JP | 6-97319 A | 4/1994 |
|---|---|---|
| JP | 2003-152009 A | 5/2003 |

* cited by examiner

Primary Examiner — Hung Vu
(74) Attorney, Agent, or Firm — Foley & Lardner LLP

(57) ABSTRACT

A semiconductor device in which a flip chip is mounted which can change a potential of a specific terminal without changing a design of a package external. The semiconductor device includes an IC chip having a bump for an external terminal, and a package in which the IC chip is mounted. The package includes an inner lead portion that supplies a first signal or a second signal to the external terminal. The inner lead portion has a pattern of an inner lead that can change a signal to be supplied to the external terminal to the first signal or the second signal according to a position at which the IC chip is mounted.

7 Claims, 13 Drawing Sheets

B-B'

B-B'

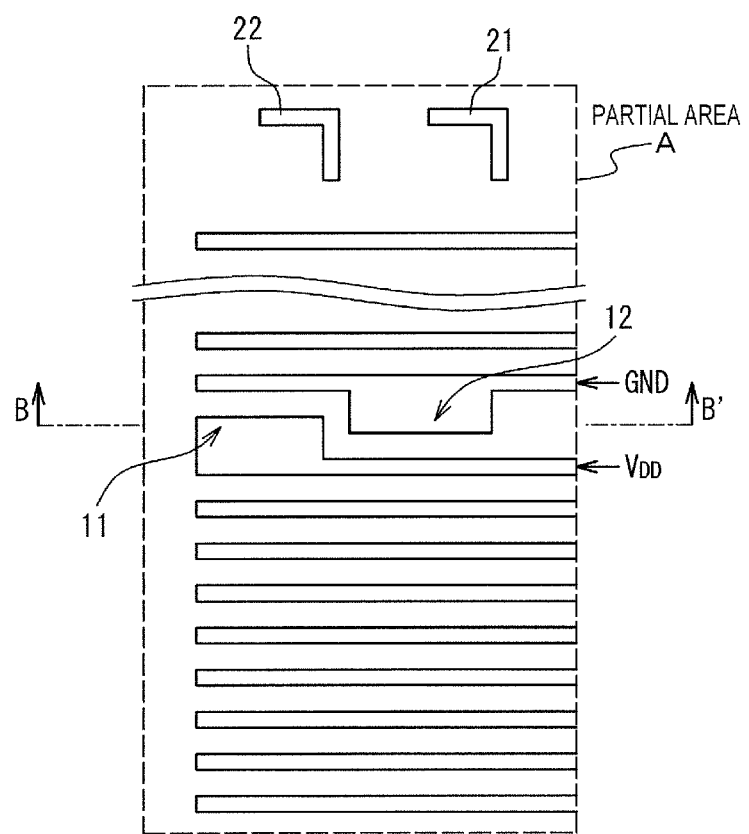

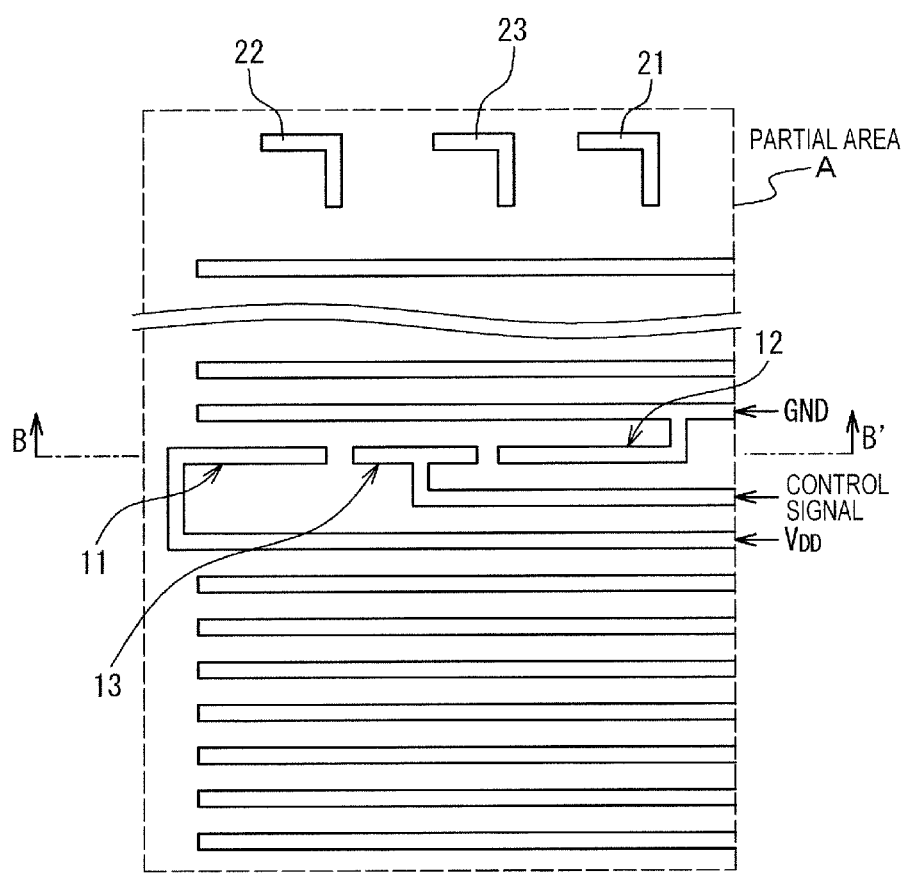

SEMICONDUCTOR DEVICE

CROSS-REFERENCE TO RELATED APPLICATIONS

The disclosure of Japanese Patent Application No. 2011-203005 filed on Sep. 16, 2011, including the specification, drawings, and abstract is incorporated herein by reference in its entirety.

BACKGROUND

The present invention relates to a semiconductor device, and more particularly to a semiconductor device having a bump as an external terminal of a chip.

There has been known a semiconductor device in which a part of input terminals (control terminals) is set to Hi or Lo to switch an operation mode to another for use. In the semiconductor device of this type, functions suited for users can be switchingly used by one IC (integrated circuit) chip, and therefore the development costs of the IC chips can be suppressed.

In general, in order to set a specific terminal of the IC chip to Hi or Lo, the terminal is configured by an external terminal of a package of the semiconductor device to set a potential. As a method of applying the potential of Hi or Lo to the external terminal, there are a method of setting the potential by a coupling substrate to be coupled to the semiconductor device, and a method of setting the potential by another device over the coupling substrate. For example, when the semiconductor device is an LCD (liquid crystal display) device, the semiconductor device is coupled to a timing controller. These methods represent a change in the coupling substrate or a change in the setting of another device over the coupling substrate, and therefore the development costs are reduced, and the a development period is short as compared with the development of the different IC chips suited for the functions of the users. However, the change in the coupling substrate and the change in the setting of another device over the coupling substrate cannot be imposed on a user side for the manufacturing reasons of the semiconductor device by semiconductor manufacturers. For that reason, in the semiconductor manufacturers, a potential of the specific terminal is switched to another at the stage of packaging the semiconductor device, thereby making an attempt to make the setting change in the outside of the semiconductor device unnecessary.

As a related art in the field of the present invention, there are Japanese Unexamined Patent Publication Nos. 2003-152009 and Hei 6 (1994)-97319.

FIGS. 1A and 1B are diagrams illustrating the semiconductor device disclosed in Japanese Unexamined Patent Publication No. 2003-152009. Japanese Unexamined Patent Publication No. 2003-152009 discloses the invention that two leads 103a and 103c extend under a chip, and control terminals 101 and 102 are switchingly coupled to extended leading terminals of the leads 103a and 103c by wire bonding (FIG. 1A), or base terminals of the leads 103a and 103c by wire bonding (FIG. 1B). According to the invention of this literature, the operation mode of the semiconductor device having the same chip and the same pattern can be changed according to only the bonding position.

FIG. 2 is a diagram illustrating a semiconductor device according to Japanese Unexamined Patent Publication No. Hei 6 (1994)-97319. In Japanese Unexamined Patent Publication No. Hei 6 (1994)-97319, band-like conductor pieces (auxiliary leads) 113a and 113b, which are isolated from each other, are arranged in the periphery of an area over which a chip 111 is mounted. An external terminal 123 is located at a position closest to a lower left area of the chip 111. An inner lead 113 extended from the external terminal 123 is coupled (bonded) to the auxiliary lead 113a so that the auxiliary lead 113a can be bonded to a pad in an upper right area of the chip 111 by a wire 115. Also, the external terminal 126 is located at a position closest to the upper right area of the chip 111. However, the external terminal 126 can be bonded to the auxiliary lead 113b so as to be bonded to the pad in a lower left area of the chip through the auxiliary lead 113b. According to the invention of this literature, a pin array of the package can be set up regardless of the bonding pad array of a semiconductor chip.

The related art of this type cannot be applied to a thin packet because the wire bonding is essential and the package is thickened by the thickness of the wire. For example, in a TAB (tape automated bonding) package representative of a thin package, a protruded electrode (bump) disposed over an IC chip, and a terminal over a tape are coupled directly to each other (flip chip bonded). Therefore, the related art that switches the coupling by the bonding wire cannot be applied to the TAB package.

SUMMARY

In the semiconductor device over which the flip chip is mounted, a semiconductor device has been demanded which can change a signal to be supplied to a specific terminal without changing a design of the package external.

In order to solve the above problem, the present invention applies a device described below. In order to clarify a correspondence relationship between the description of "What is Claimed is" and the description of "Detailed Description", reference numerals and symbols used in "Detailed Description" are added in the description of the technical matter configuring the device. However, the added numerals and symbols shall not be used to definitely interpret the technical scope of the present invention disclosed in "What is Claimed is".

A semiconductor device according to the present invention includes an IC chip (1) having a bump for an external terminal, and a package (2) in which the IC chip is mounted, in which the package (2) includes an inner lead portion (25) that supplies a first signal or a second signal to the external terminal. The inner lead portion (25) has a pattern of an inner lead that can change a signal to be supplied to the external terminal to the first signal or the second signal.

According to the present invention, in the semiconductor device having a flip chip mounted therein in which a signal to be supplied to a specific terminal can be changed without changing a design of a package external.

BRIEF DESCRIPTION OF THE DRAWINGS

FIG. 8 is a cross-sectional view of a second modified example of the inner lead pattern in FIG. 4A;

FIG. 10 is a plan view of an inner lead pattern in the partial area of FIG. 3 according to a third embodiment;

DETAILED DESCRIPTION

First Embodiment

A semiconductor device according to a first embodiment will be described below with reference to the accompanying drawings.

First, a configuration of the semiconductor device according to this embodiment will be described.

Figure 1:
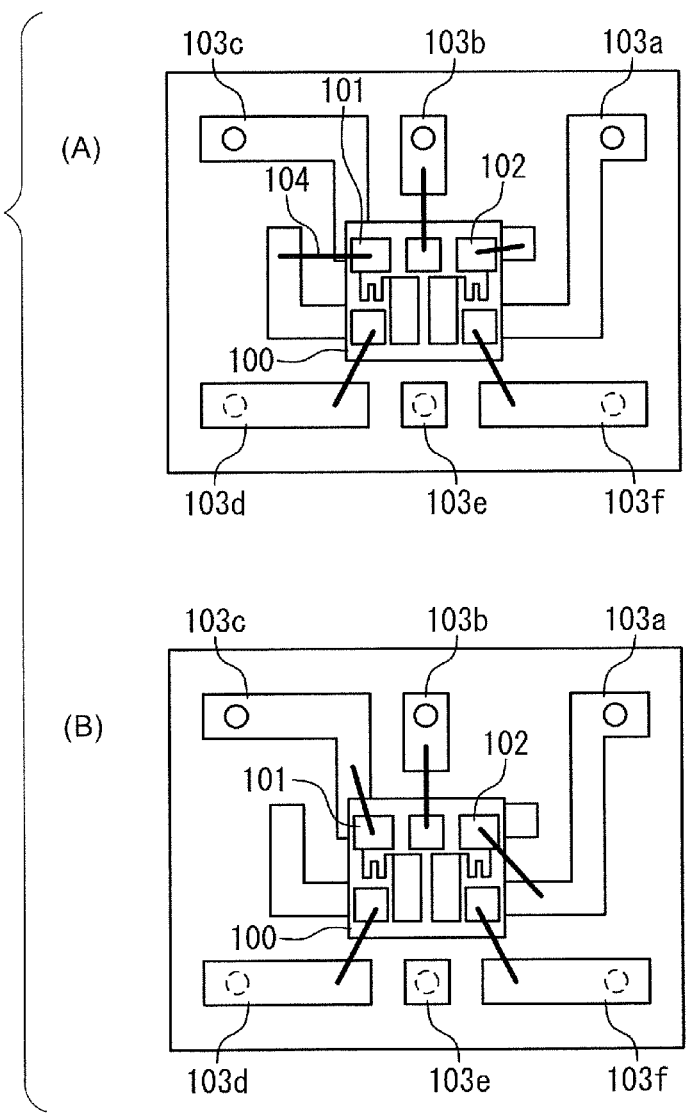
FIGS. 1A and 1B are plan views illustrating a semiconductor device disclosed in Japanese Unexamined Patent Publication No. 2003-152009.
Figure 2:
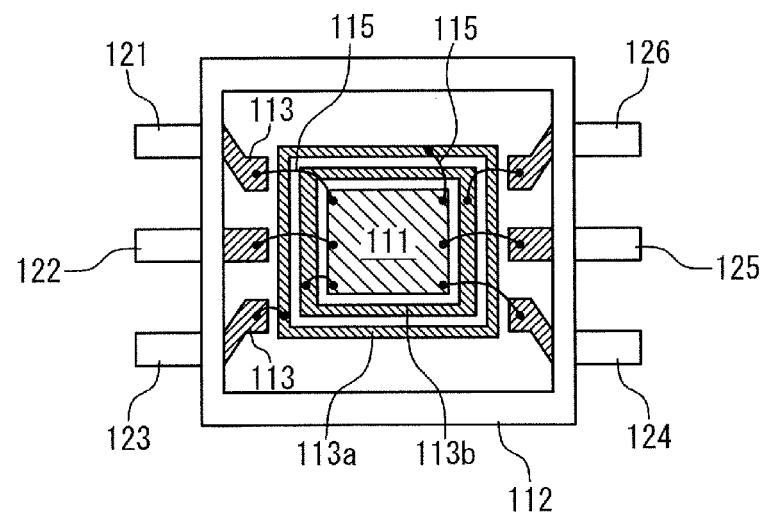
FIG. 2 is a plan view illustrating a semiconductor device disclosed in Japanese Unexamined Patent Publication No. Hei 6 (1994)-97319.
Figure 3:
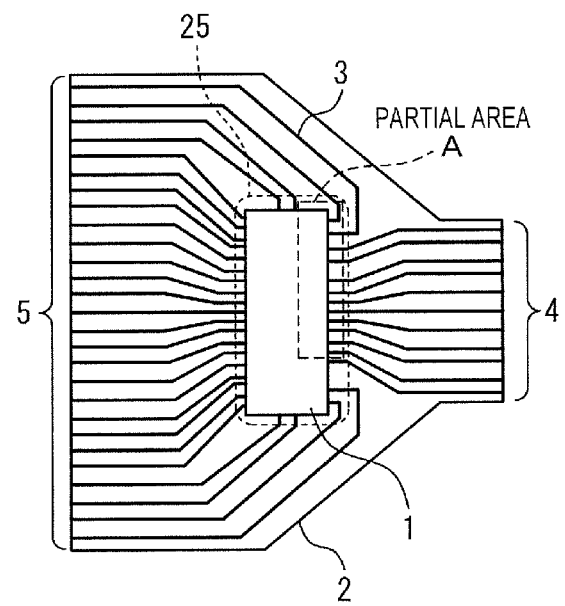
FIG. 3 is a plan view of a semiconductor device according to a first embodiment of the present invention.

FIG. 3 is a plan view of a semiconductor device according to the embodiment of the present invention. The semiconductor device according to this embodiment includes an IC chip 1 and a package 2. The package 2 functions to protect the IC chip 1 and electrically couple the IC chip 1 with a coupling substrate over which other external devices are mounted. The package 2 includes a plurality of input terminals 4 and a plurality of output terminals 5 as external terminals. Within the package 2, the IC chip 1 and the other external devices are electrically coupled with each other from the external terminals through leads 3. The coupling of the IC chip 1 and the leads 3 are conducted by coupling protruded electrodes (bumps), which are external electrodes of the IC chip, with a portion (inner lead portion 25) of the leads 3 which is over- lapped with the IC chip 1. In general, the bumps and the inner leads are coupled with each other by thermocompression. Thereafter, an encapsulation resin is allowed to flow into between the inner lead portion 25 and a lower surface of the IC chip 1, and the package 2 and the IC chip 1 are mechanically bonded together, and protected from an external environment.

For example, when the semiconductor device is a driver of the display device, the input terminals 4 are coupled with an external device called "timing controller" and a coupling substrate over which a power supply is mounted, and the output terminals 5 are coupled with a display panel. The input terminals 4 include an input terminal coupled to an input terminal of the IC chip 1, and a supply terminal that supplies an electric power to a supply terminal of the IC chip 1. An output terminal that outputs a signal to the coupling substrate is included depending on a product. In an example of the semiconductor device in FIG. 3, although the number of external terminals is small on the ground of drawing, for example, if the semiconductor device is the driver of the display device, there are the input terminals 4 of about a dozen to one hundred, and the output terminals 5 of hundreds to more than one thousand.

Figure 4A:
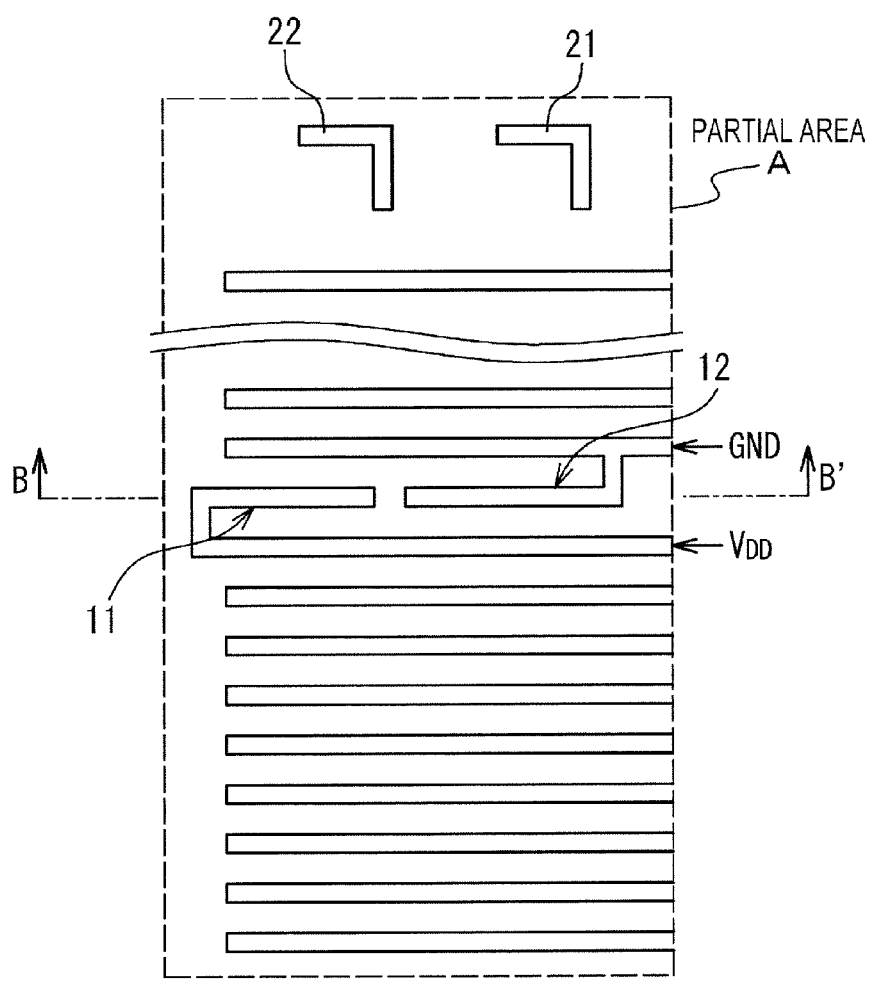
FIG. 4A is a plan view of an inner lead pattern in a partial area of an inner lead portion according to the first embodiment.

In the embodiment of the present invention, a pattern of the inner lead in the package 2 is important. FIG. 4A is a plan view of an inner lead pattern in a partial area A of an inner lead portion 25 according to the first embodiment. A pitch alignment mark 21 and a pitch alignment mark 22 are used for positioning when the IC chip 1 is mounted over the package 2. An inner lead 11 is coupled to $V_{DD}$, and an inner lead 12 is coupled to GND. The shape of the inner lead 11 is formed by bending the inner lead at two portions, and folding back the inner lead with respect to the axis B-B' in a direction B' as illustrated in FIG. 4A. The shape of the inner lead 12 is formed by bending the branched inner lead, and extending the inner lead with respect to the axis B-B' in the direction B as illustrated in FIG. 4A. The inner lead 11 and the inner lead 12 are wired to face each other on the axis B-B', and isolated from each other.

Figure 4B:
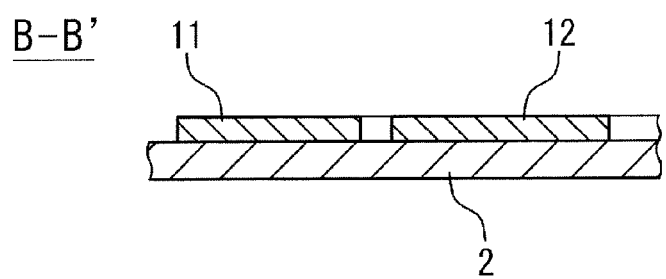
FIG. 4B is a B-B' cross-sectional view of the partial area taken along an axis B-B' illustrated in FIG. 4A.

FIG. 4B is a B-B' cross-sectional view of the partial area A taken along an axis B-B' illustrated in FIG. 4A. The inner leads are stacked on an upper surface of the package 2. A left side of the inner leads isolated from each other is the inner lead 11 coupled to $V_{DD}$, and a right side thereof is the inner lead 12 coupled to GND.

Figure 5A:
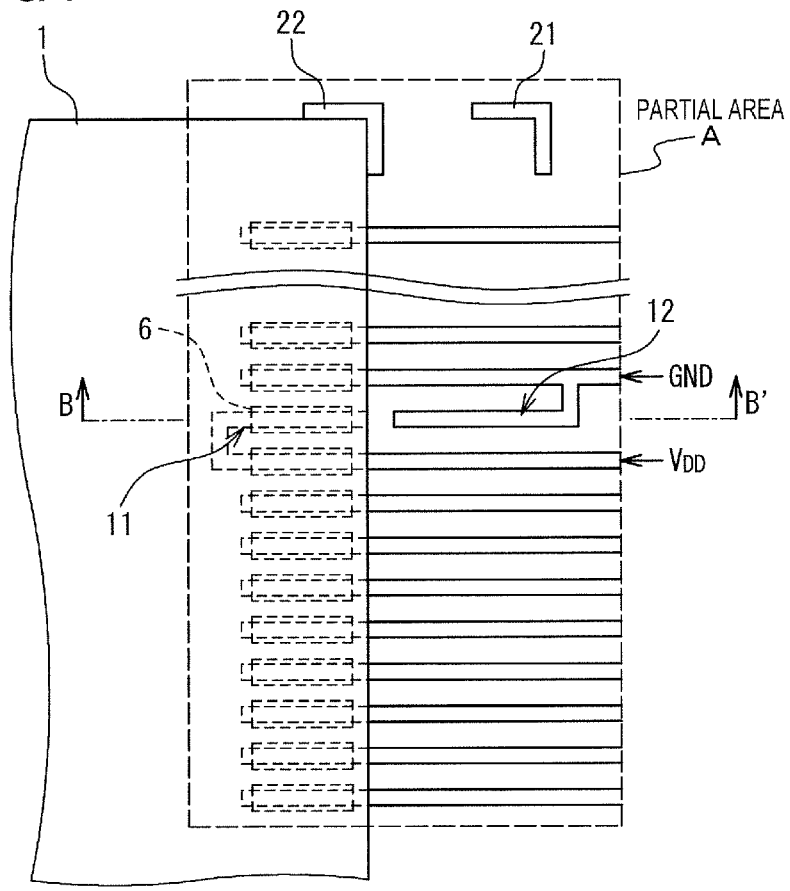
FIG. 5A is a diagram illustrating a case in which an external terminal of an IC chip is coupled to $V_{DD}$ in the inner lead pattern illustrated in FIG. 4A.

FIG. 5A is a diagram illustrating a case in which an external terminal of the IC chip 1 is coupled to $V_{DD}$ in the inner lead pattern illustrated in FIG. 4A. The IC chip 1 is arranged to align with the pitch alignment mark 22 to electrically couple the external terminal (control terminal) of the IC chip 1 with the inner lead 11.

Figure 5B:
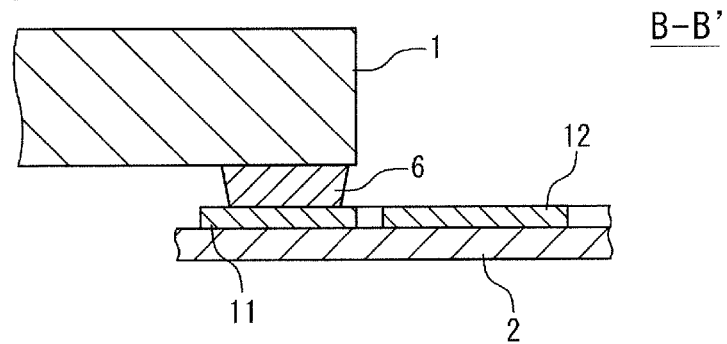
FIG. 5B is a diagram illustrating a case in which the external terminal of the IC chip is coupled to $V_{DD}$ in the inner lead pattern illustrated in FIG. 4B.

FIG. 5B is a diagram illustrating a case in which the external terminal of the IC chip 1 is coupled to $V_{DD}$ in the inner lead pattern illustrated in FIG. 4B. The control terminal of the IC chip 1 and the inner lead 11 coupled to $V_{DD}$ are electrically coupled with each other by a bump 6 formed over the control terminal of the IC chip 1.

Figure 6A:
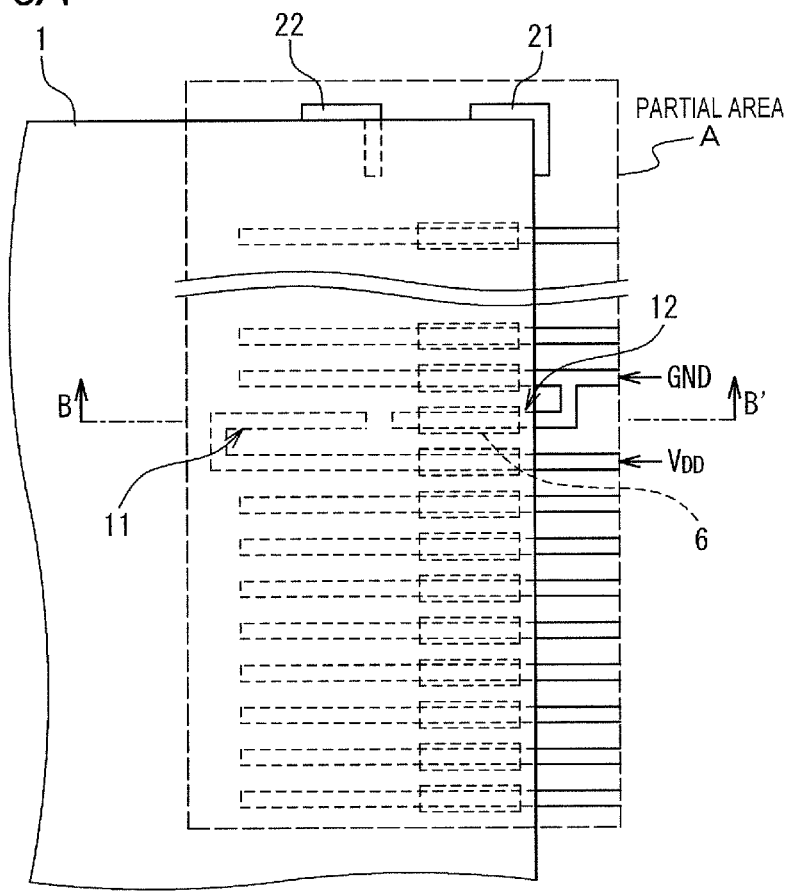
FIG. 6A is a diagram illustrating a case in which the external terminal of the IC chip is coupled to GND in the inner lead pattern illustrated in FIG. 4A.

FIG. 6A is a diagram illustrating a case in which the external terminal of the IC chip 1 is coupled to GND in the inner lead pattern illustrated in FIG. 4A. The IC chip 1 is arranged to align with the pitch alignment mark 21 to electrically couple the control terminal of the IC chip 1 with the inner lead 12.

Figure 6B:
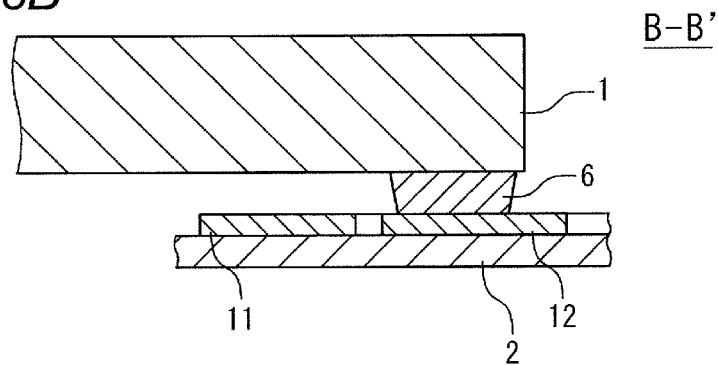
FIG. 6B is a diagram illustrating a case in which the external terminal of the IC chip is coupled to GND in the inner lead pattern illustrated in FIG. 4B.

FIG. 6B is a diagram illustrating a case in which the external terminal of the IC chip 1 is coupled to GND in the inner lead pattern illustrated in FIG. 4B. The control terminal of the IC chip 1 and the inner lead 12 coupled to GND are electrically coupled with each other by a bump 6 formed over the control terminal of the IC chip 1.

As illustrated in FIGS. 5A and 6A, a bent portion of the inner lead 11 is disposed inside of the IC chip 1 more than the coupling position of the bump, and the branched portion of the inner lead 12 disposed outside of the IC chip 1. This is so designed as not to prevent a flow of an encapsulation resin when the encapsulation resin flows to bond the IC chip 1 and the package 2 together.

For facilitation of description, an example in which the pitch alignment marks 21 and 22 are aligned with the corner of the IC chip 1 is described. In fact, in a singulation process of singulating the IC chip 1 from a wafer, an error occurs in the position of the corner of the IC chip 1. For that reason, if a pitch of the inner leads is short, a method with higher precision is applied. For example, if a base material of the package 2 is a translucent TAB tape, the respective marks high in positioning precision are located over the IC chip 1 and the package 2. The marks are optically aligned with each other from the back of a surface of the package 2 over which the IC chip 1 is mounted, to thereby make positioning with higher precision possible. Also, the pitch alignment marks may be located on not only one corner over the IC chip 1 as illustrated in FIG. 4A, but also another position located diagonally or the like, to thereby enhance the positioning precision in a rotating direction. Also, a coupling status of the inner lead and the bump may be optically directly observed for positioning, without using a specific pitch alignment mark.

The inner lead coupled to the bump on each short side of the IC chip 1 in FIG. 3 needs to be coupled to the same bump even if the IC chip 1 is aligned with any pitch alignment sign. For example, the inner lead coupled to the bump on the short side is provided with a coupling portion with a bump having a length equal to or longer than a distance between a pitch alignment mark 0 and a pitch alignment mark 1, in parallel to the short side of the IC chip 1. Alternatively, there is proposed a method in which, as with an inner lead 17 and an inner lead 19 which will be described in a fifth embodiment (FIGS. 13A to 14B) later, both of the coupling portion when being aligned with the pitch alignment mark 0 and the coupling portion when being aligned with the pitch alignment mark 1 are coupled to the same lead.

According to the semiconductor device of this embodiment, even if the same IC chip 1 and package 2 are coupled together by a flip chip, the pitch alignment mark to be aligned with the IC chip 1 is changed so that a potential of a specific input terminal (control terminal) can be set to Hi ($V_{DD}$) or Lo (GND). As a result, when the IC chip 1 has two operation modes, the operation mode can be selected at a stage of packaging, and plural types of semiconductor devices can be manufactured in a short time. Also, because the IC chip 1 and the package 2 are the same, the manufacturing costs of those members can be more reduced, and a reduction in the costs can be realized by volume efficiency.

The advantages of the semiconductor device according to this embodiment can be obtained with the cross-sectional structure of FIG. 4B, and therefore the present invention is not limited to the pattern of the inner leads in FIG. 4A.

Figure 7:
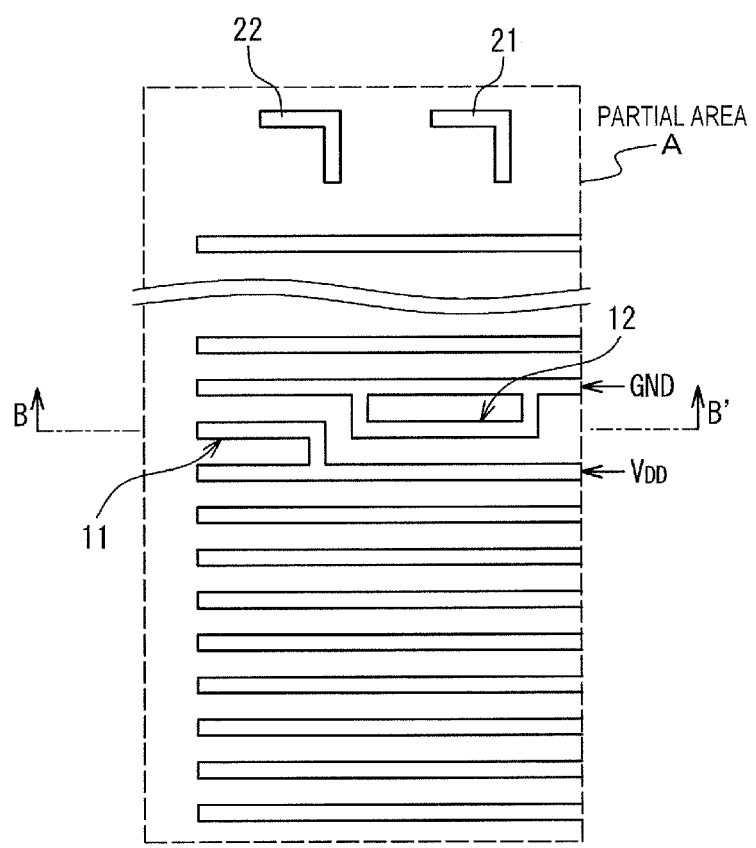
FIG. 7 is a cross-sectional view of a first modified example of the inner lead pattern in FIG. 4A.

FIG. 7 illustrates a first modified example of the inner lead pattern in FIG. 4A. The inner lead 11 is coupled to $V_{DD}$, and the inner lead 12 is coupled to GND. The shape of the inner lead 11 is formed by extending the branched inner lead in the direction B with respect to the axis B-B' in a direction B as illustrated in FIG. 7. The shape of the inner lead 12 is formed by bending the branched inner lead, extending the inner lead with respect to the axis B-B' in the direction B, and again bending the inner lead toward the branching inner lead direction to join those inner leads together as illustrated in FIG. 7 (loop shape). If there arises no problem with a wiring of the inner lead traversing a flow of the encapsulation resin between the inner lead portion 25 and the lower surface of the IC chip 1, the semiconductor device can be designed with the above shaped.

FIG. 8 illustrates a second modified example of the inner lead pattern in FIG. 4A. The inner lead 11 is coupled to $V_{DD}$, and the inner lead 12 is coupled to GND. The widths of the inner leads are widened to form the inner lead 11 and the inner lead 12, and the inner lead 11 and the inner lead 12 face each other in the axis B-W.

Even if the partial area A has the patterns of the inner leads illustrated in FIGS. 7 and 8, because the cross-sectional structure of FIG. 4B is obtained, the advantages of the semiconductor device according to this embodiment can be obtained.

Second Embodiment

A semiconductor device according to a second embodiment will be described below with reference to the accompanying drawings. A configuration of the semiconductor device according to this embodiment is identical with that of the first embodiment illustrated in FIG. 3, and therefore a description thereof will be omitted.

Figure 9A:
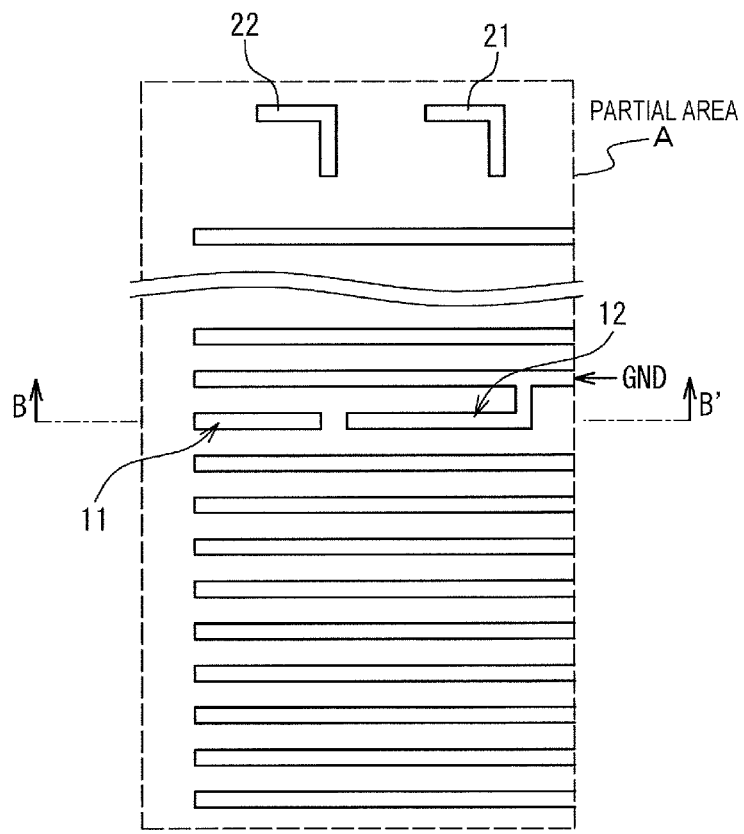
FIG. 9A is a plan view of an inner lead pattern in the partial area of FIG. 3 according to a second embodiment.

FIG. 9A is a plan view of an inner lead pattern in the partial area A of FIG. 3 according to the second embodiment. The inner lead 11 is a dummy lead for coupling the bump 6 of the control terminal of the input terminal 4 that becomes in an open state. The inner lead 12 is coupled to GND. The shape of the inner lead 12 is identical with that of the inner lead 12 in FIG. 4A according to the first embodiment.

Figure 9B:
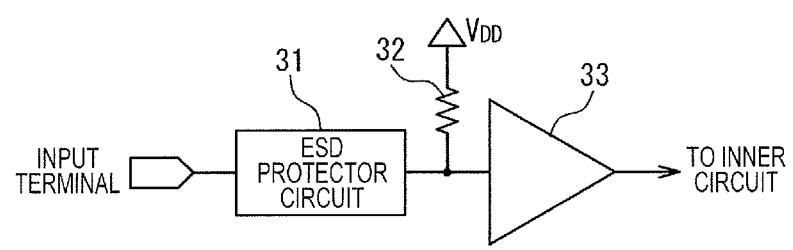
FIG. 9B is an equivalent circuit diagram of an input terminal of the IC chip which is coupled to an inner lead in FIG. 9A.

In the semiconductor device according to this embodiment, when the IC chip 1 is aligned with the pitch alignment mark 22, the control terminal of the IC chip 1, which corresponds to the bump coupled with the inner lead 11, becomes in the open state. For that reason, the control terminal of the IC chip 1 is pulled up to $V_{DD}$, and set to Hi ($V_{DD}$). FIG. 9B is an equivalent circuit diagram of the input terminal (control terminal) of the IC chip 1 which is coupled to the inner lead 11 in FIG. 9A. The equivalent circuit in FIG. 9B includes an ESD (electrostatic discharge) protection circuit 31, a pull-up resistor 32, and a buffer 33. The control terminal of the IC chip 1 that becomes in the open state is coupled with the pull-up resistor 32 coupled to $V_{DD}$, and an input signal is set to Hi ($V_{DD}$).

In the semiconductor device according to this embodiment, when the IC chip 1 is aligned with the pitch alignment mark 21, as in FIG. 6A, the bump of the control terminal of the IC chip 1 is coupled with the inner lead 12 that is GND. In this case, an input terminal of the buffer 33 is applied with a voltage level developed by dividing a voltage by the pull-up resistor 32 coupled to $V_{DD}$ and the control terminal coupled to GND through the ESD protection circuit 31. Because a DC resistance of the ESD protection circuit 31 is sufficiently smaller than a DC resistance of the pull-up resistor 32, a voltage of a low (Lo) level close to substantially GND is applied to the input terminal of the buffer 33.

Thus, even in the second embodiment of the present invention, the signal to be supplied to the external terminal can be changed according to a position at which the IC chip is mounted.

When the control terminal is coupled to the inner lead 12, the inner lead 11 exists over the package 2 in the open state where no voltage is set. If there arises no problem when the IC chip is mounted over the package 2, the bump of the control terminal may be coupled nowhere with a configuration having no inner lead 11. This is because if a wiring pattern set with no voltage exists in a portion where a distance between the patterns is the minimum as with the inner lead, an ESD resistance of the display device may be weakened.

In FIGS. 9A and 9B, the control terminal of the IC chip 1 which becomes opened when being coupled to the inner lead 11 may be coupled with a pull-down resistor coupled to GND instead of the pull-up resistor 32 coupled to $V_{DD}$, and the input signal may be set to Lo (GND). In this case, the inner lead 12 is coupled to $V_{DD}$, and the potential of the control terminal of the IC chip 1 is switched to Hi ($V_{DD}$) or Lo (GND) according to the selection of the pitch alignment mark 21 or the pitch alignment mark 22.

In the semiconductor device according to the second embodiment, unlike the first embodiment, the inner lead necessary to change the operation mode may be coupled to any one of Hi ($V_{DD}$) and Lo (GND). For that reason, according to the semiconductor device of the second embodiment, there is no need to align the inner lead coupled to $V_{DD}$ and the inner lead coupled to GND, and the position of the external terminal can be freely designed.

Third Embodiment

A semiconductor device according to a third embodiment will be described below with reference to the accompanying drawings. A configuration of the semiconductor device according to this embodiment is identical with that of the first embodiment illustrated in FIG. 3, and therefore a description thereof will be omitted.

FIG. 10 is a plan view of an inner lead pattern in the partial area A of FIG. 3 according to the third embodiment. The semiconductor device according to this embodiment is different from the semiconductor device of the first embodiment in that there are three pitch alignment marks. As illustrated in FIG. 10, in the pattern of the inner lead in the semiconductor device according to this embodiment, an inner lead 13 is added between the inner lead 11 and the inner lead 12. Also, a pitch alignment mark 23 for aligning the bump with the inner lead 13 is added. The inner lead 11 is coupled to $V_{DD}$. The inner lead 12 is coupled to GND. The inner lead 13 is coupled to an electrode for transmitting the control signal to the IC chip 1. The inner lead 11, the inner lead 12, and the inner lead 13 are wired on the axis B-B', and isolated from each other, as illustrated in FIG. 10.

When the IC chip 1 is aligned to the pitch alignment mark 21, the external terminal (control terminal) is set to Lo (GND) as in the semiconductor device of the first embodiment. When the IC chip 1 is aligned to the pitch alignment mark 22, the external terminal is set to Hi ($V_{DD}$) as in the semiconductor device of the first embodiment. When the IC chip 1 is aligned to the pitch alignment mark 23, the control signal is supplied from the external so that a logical value of the external terminal can be switched to another from the external.

According to the semiconductor device of this embodiment, the operation mode of the IC chip 1 can be easily changed through the inner lead 13 according to the control signal from the external. As a result, semiconductor device products in which the same IC chip 1 and package 2 are combined together can be provided to three parties such as one customer requiring any one of two operation mode of the IC chip 1, and another customer that selectively uses the two modes.

Fourth Embodiment

A semiconductor device according to a fourth embodiment will be described below with reference to the accompanying drawings. A configuration of the semiconductor device according to this embodiment is identical with that of the first embodiment illustrated in FIG. 3, and therefore a description thereof will be omitted.

Figure 11:
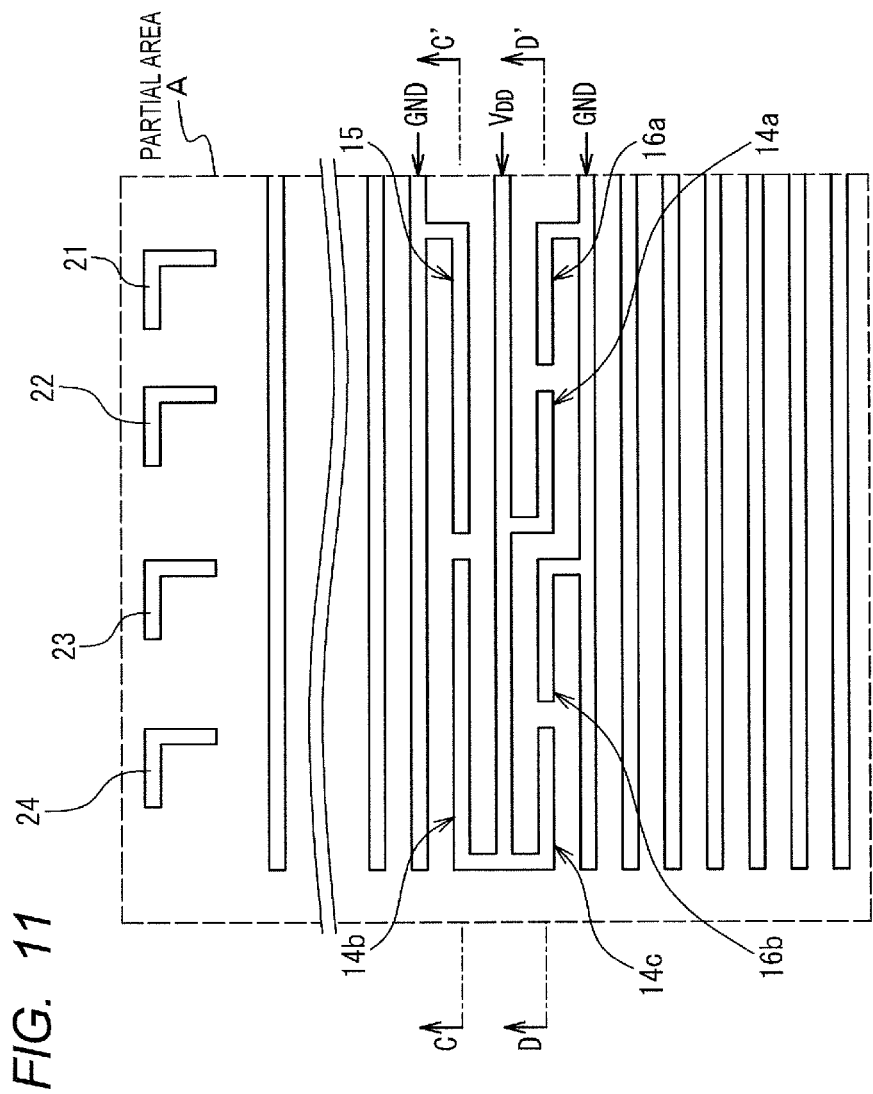
FIG. 11 is a plan view of an inner lead pattern in the partial area of FIG. 4 according to a fourth embodiment.

FIG. 11 is a plan view of an inner lead pattern in the partial area A of FIG. 4 according to the fourth embodiment. The semiconductor device according to this embodiment is different from the other embodiments in that there are four pitch alignment marks, and the combination of signals from two external terminals (control terminals) can be switched to another. As illustrated in FIG. 11, inner leads 14a to 14c are formed by branching one inner lead coupled to $V_{DD}$. An inner lead 15 is formed by branching an inner lead coupled to GND as illustrated in FIG. 11. As illustrated in FIG. 11, inner leads 16a and 16b are formed by branching an inner lead coupled to GND at two portions. The inner lead 15 and the inner lead 14b are wired on an axis C-C', and isolated from each other as illustrated in FIG. 11. The inner lead 16a, the inner lead 14a, the inner lead 16b, and the inner lead 14c are wired on an axis D-D', and isolated from each other as illustrated in FIG. 11.

When the IC chip 1 is aligned with the pitch alignment mark 21, the external terminal coupled to the inner lead 15 is set to Lo (GND), and the external terminal coupled to the inner lead 16a is set to Lo (GND).

When the IC chip 1 is aligned with the pitch alignment mark 22, the external terminal coupled to the inner lead 15 is set to Lo (GND), and the external terminal coupled to the inner lead 14a is set to Hi ($V_{DD}$).

When the IC chip 1 is aligned with the pitch alignment mark 23, the external terminal coupled to the inner lead 14b is set to Hi ($V_{DD}$), and the external terminal coupled to the inner lead 16b is set to Lo (GND).

When the IC chip 1 is aligned with the pitch alignment mark 24, the external terminal coupled to the inner lead 14b is set to Hi ($V_{DD}$), and the external terminal coupled to the inner lead 14c is set to Hi ($V_{DD}$).

According to the semiconductor device of this embodiment, the coupling position of the IC chip 1 and the package 2 is changed so that the control signals of different two-bit widths can be supplied to the IC chip 1, and four kinds of operation modes can be switched for the IC chip 1. When a region of the inner leads used for switching the control signal is increased, the operation mode can be switched according to a control signal having the bit width of three or more bits in the same method as that of the control signal of the two-bit width.

Fifth Embodiment

Figure 12:
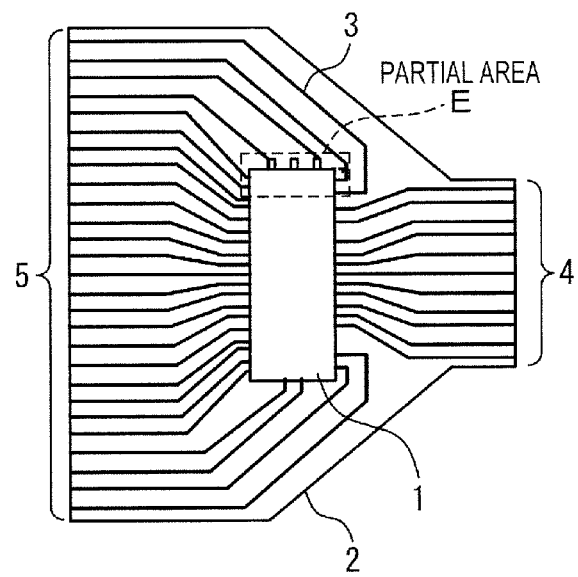
FIG. 12 is a plan view of a semiconductor device according to a fifth embodiment of the present invention.

A semiconductor device according to a fifth embodiment will be described below with reference to the accompanying drawings. FIG. 12 is a plan view of the semiconductor device according to the fifth embodiment of the present invention. In this embodiment, the present invention is applied in not a long side of the IC chip 1 but a short side (partial area E in FIG. 12) thereof. A configuration of the semiconductor device according to this embodiment is identical with that of the first embodiment illustrated in FIG. 3, and therefore a description thereof will be omitted.

Figure 13A:
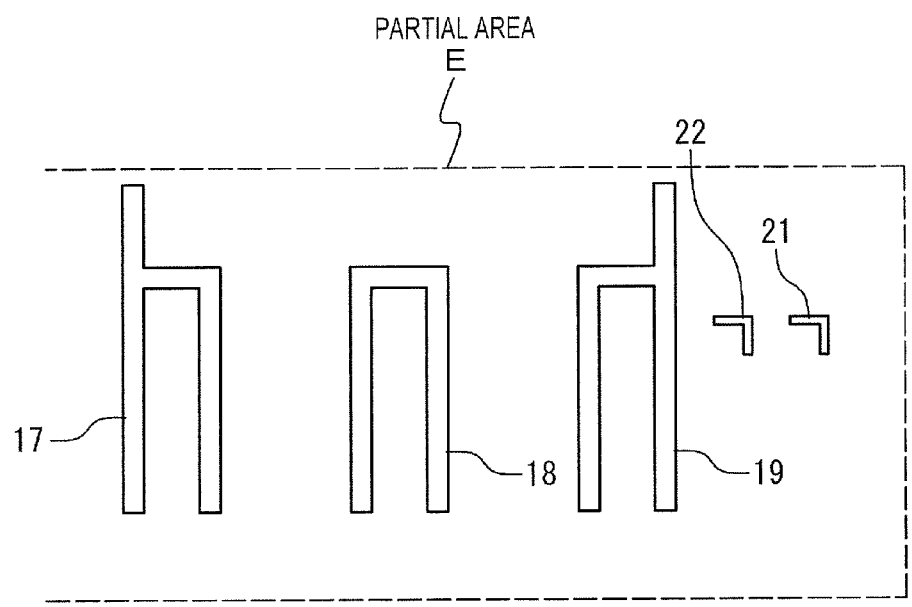
FIG. 13A is a plan view of a partial area of a package in the semiconductor device according to the fifth embodiment of the present invention.

FIG. 13A is a plan view of a partial area E of a package in the semiconductor device according to the fifth embodiment of the present invention. The partial area E of the package 2 includes the pitch alignment mark 21, the pitch alignment mark 22, an inner lead 17, an inner lead 18, and an inner lead 19. Branched portions of the inner lead 17 and the inner lead 19 are located outside of the coupling portion of the IC chip 1, and even if the IC chip 1 is aligned with any pitch alignment mark, the bump is coupled to the same lead. As illustrated in FIG. 13A, the inner lead 18 is U-shaped. In the semiconductor device according to this embodiment, the coupling position with the package 2 is changed on the short side of the IC chip 1. For that reason, there is a need to ensure a coupleable area having a sufficient length for the inner lead to be coupled with the external terminal on the long side of the IC chip 1 so that the lead can be coupled with the same bump even if the IC chip 1 is aligned with any one of the pitch alignment marks 21 and 22.

Figure 13B:
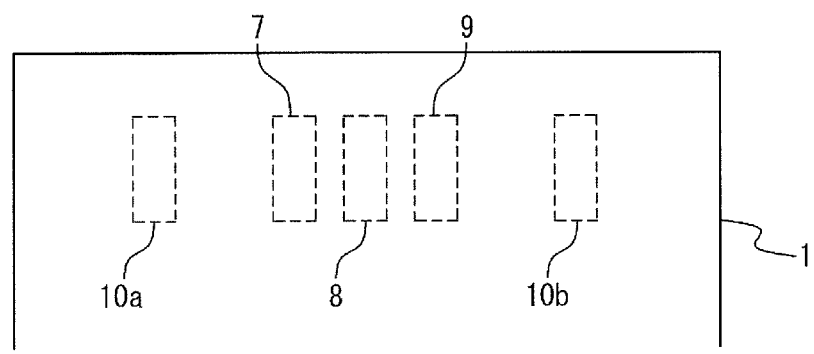
FIG. 13B is a plan view of a partial area of the IC chip in the semiconductor device according to the fifth embodiment of the present invention.

FIG. 13B is a plan view of the partial area E of the IC chip in the semiconductor device according to the fifth embodiment of the present invention. A GND output terminal 7 outputs Lo (GND). A control terminal 8 is coupled to Lo (GND) or Hi ($V_{DD}$). A control terminal 9 outputs Hi ($V_{DD}$). As illustrated in FIG. 13B, the GND output terminal 7 and the control terminal 9 are arranged on both sides of the control terminal 8. An external terminal 10a and an external terminal 10b are general terminals.

Figure 14A:
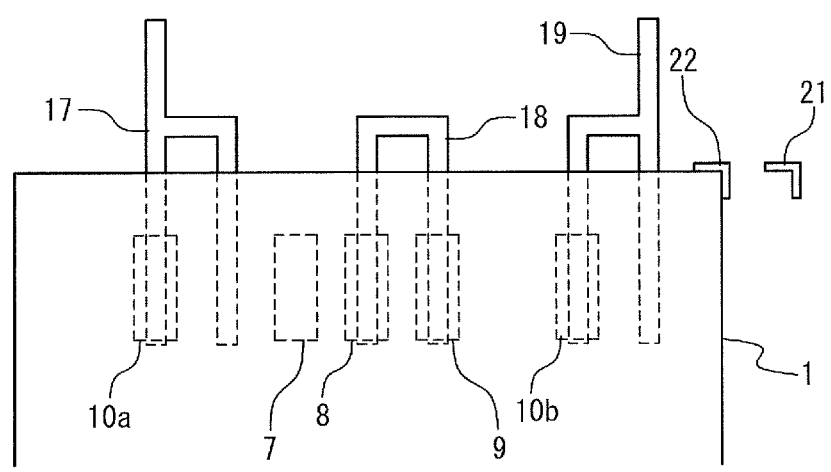
FIG. 14A is a diagram illustrating a case in which a control terminal of the semiconductor device is set to Hi ($V_{DD}$) by aligning the control terminal with one pitch aligning mark according to the fifth embodiment of the present invention.

FIG. 14A is a diagram illustrating a case in which the control terminal 8 is set to Hi ($V_{DD}$) by aligning the control terminal 8 with the pitch alignment mark 22 in the semiconductor device according to the fifth embodiment of the present invention. As illustrated in FIG. 14A, a bump of the control terminal 8 and a bump of the $V_{DD}$ control terminal 9 are coupled with each other by the U-shaped inner lead 18 whereby the control terminal 8 is set to Hi ($V_{DD}$).

Figure 14B:
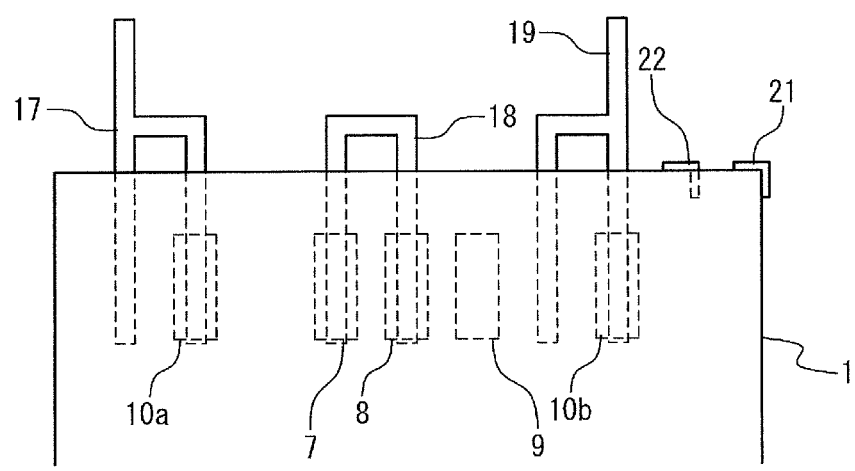
FIG. 14B is a diagram illustrating a case in which a control terminal of the semiconductor device is set to Lo (GND) by aligning the control terminal with another pitch aligning mark according to the fifth embodiment of the present invention.

FIG. 14B is a diagram illustrating a case in which the control terminal 8 is set to Lo (GND) by aligning the control terminal 8 with the pitch alignment mark 21 in the semiconductor device according to the fifth embodiment of the present invention. As illustrated in FIG. 14B, the bump of the control terminal 8 and the bump of the GND output terminal 7 are coupled with each other by the U-shaped inner lead 18 whereby the control terminal 8 is set to Lo (GND).

In either case of FIGS. 14A and 14B, an external terminal 10a is coupled to the same inner lead 17. Likewise, an external terminal 10b is coupled with the same inner lead 19.

According to the semiconductor device of this embodiment, the control terminal 8 can be arranged on the short side of the IC chip 1. Also, as illustrated in FIG. 13B, in the GND output terminal 7, the control terminal 8, and the $V_{DD}$ control terminal 9, the coupling position of the IC chip 1 and the package 2 is shifted by a pitch of the bump so that the setting can be changed.

In this embodiment, a signal to be supplied to the control terminal is supplied to the output terminals 7 and 9 of the IC chip 1. This is because, as is apparent from FIG. 12, since the leads 3 of the output signal are located outside of the short side, wiring cannot be performed by drawing the leads of the power supplies ($V_{DD}$, GND) from the external in the package 2 of an inexpensive one-layer wiring.

Conversely, the signal to be supplied to the control signal in the first to fourth embodiments is supplied thereto from the external through the lead. In this embodiment, an output signal of the IC chip can be used.

The embodiments of the present invention have been described above with reference to the accompanying drawings. The present invention is not limited to the above-mentioned embodiments, but can be appropriately changed by an ordinary skilled person without departing from the subject matter of the invention.

What is claimed is:

1. A semiconductor device comprising:
an IC chip having a bump for an external terminal; and
a package in which the IC chip is mounted,
wherein the package includes an inner lead portion that supplies a first signal or a second signal to the external terminal, and
wherein the inner lead portion has a pattern of an inner lead that can change a signal to be supplied to the external terminal to the first signal or the second signal according to a position at which the IC chip is mounted.

2. The semiconductor device according to claim 1, wherein the first signal is generated by a power supply for a first voltage, and the second signal is generated by a power supply for a second voltage different from the first voltage.

3. The semiconductor device according to claim 1, wherein the package includes a plurality of pitch alignment marks indicative of mounted positions, and any one of the pitch alignment marks to be aligned with the IC chip is selected to align the coupling positions of the bump and the inner lead portion.

4. The semiconductor device according to claim 1, wherein the pattern of the inner lead includes a bent pattern for changing a direction of the inner lead.

5. The semiconductor device according to claim 1, wherein the pattern of the inner lead includes a branch pattern for branching a single inner lead into a plurality of the inner leads.

6. The semiconductor device according to claim 5, wherein the pattern of the inner lead includes a joining pattern for joining the inner leads branched by the branch pattern together.

7. The semiconductor device according to claim 1, wherein the pattern of the inner lead includes the inner leads different in width according to a region thereof.

* * * * *